(12) United States Patent
Ayotte et al.

(10) Patent No.: US 9,548,275 B2
(45) Date of Patent: Jan. 17, 2017

(54) DETECTING SUDDEN CHANGES IN ACCELERATION IN SEMICONDUCTOR DEVICE OR SEMICONDUCTOR PACKAGING CONTAINING SEMICONDUCTOR DEVICE

(71) Applicant: GLOBALFOUNDRIES INC., Grand Cayman (KY)

(72) Inventors: Stephen P. Ayotte, Bristol, VT (US); Benjamin J. Pierce, Winooski, VT (US); Timothy M. Sullivan, Essex Junction, VT (US); Heather M. Truax, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 295 days.

(21) Appl. No.: 13/901,108

(22) Filed: May 23, 2013

(65) Prior Publication Data

US 2014/0346619 A1 Nov. 27, 2014

(51) Int. Cl.
*H01L 23/00* (2006.01)
*H01L 27/20* (2006.01)
*G01P 15/08* (2006.01)
*G01P 15/09* (2006.01)

(52) U.S. Cl.
CPC .......... *H01L 23/562* (2013.01); *G01P 15/0891* (2013.01); *G01P 15/09* (2013.01); *H01L 27/20* (2013.01); *H01L 2924/0002* (2013.01)

(58) Field of Classification Search
CPC ............. H01L 2924/00; H01L 2924/1461; G01P 15/123; G01P 1/023; G01P 2015/0814

USPC .......................................... 340/500, 540, 669
See application file for complete search history.

(56) References Cited

U.S. PATENT DOCUMENTS

| | | | |
|---|---|---|---|
| 3,819,252 A * | 6/1974 | Giglia | G02F 1/1525 252/500 |
| 5,612,670 A | 3/1997 | Snyder et al. | |
| 7,290,437 B1 | 11/2007 | Tanaka et al. | |
| 7,757,565 B2 | 7/2010 | Chakrabartty | |
| 7,880,247 B2 * | 2/2011 | Vaganov | G06F 3/0338 257/415 |
| 8,044,818 B2 | 10/2011 | Tysowski et al. | |
| 8,061,182 B2 | 11/2011 | Weber et al. | |
| 8,227,285 B1 | 7/2012 | Yang | |

(Continued)

FOREIGN PATENT DOCUMENTS

| | | |
|---|---|---|
| EP | 1286166 A1 | 2/2003 |
| JP | 09054043 A | 2/1997 |
| JP | 2006090960 A | 4/2006 |

*Primary Examiner* — James Yang
(74) *Attorney, Agent, or Firm* — David Cain; Hoffman Warnick, LLC

(57) ABSTRACT

An approach for detecting sudden changes in acceleration in a semiconductor device or semiconductor package containing the semiconductor device is disclosed. In one embodiment, a piezoelectric sensor is embedded in a semiconductor die. The piezoelectric sensor is configured to sense a mechanical force applied to the semiconductor die. An excessive force indicator is coupled to the piezoelectric sensor. The excessive force indicator is configured to generate an excessive force indication in response to the piezoelectric sensor sensing that the mechanical force applied to the semiconductor die has exceeded a predetermined threshold indicative of an excessive mechanical force.

20 Claims, 5 Drawing Sheets

(56) References Cited

U.S. PATENT DOCUMENTS

| | | | |
|---|---|---|---|
| 8,280,682 B2 | 10/2012 | Vock et al. | |
| 2005/0252308 A1* | 11/2005 | Hjelt | G01P 15/06 |
| | | | 73/862.041 |
| 2008/0109510 A1* | 5/2008 | Gerlt | A61J 7/04 |
| | | | 709/201 |
| 2011/0057274 A1 | 3/2011 | Nakatani et al. | |
| 2012/0079870 A1 | 4/2012 | Ramirez | |
| 2012/0306639 A1* | 12/2012 | Howard | G08B 13/1427 |
| | | | 340/539.1 |
| 2013/0141137 A1* | 6/2013 | Krutzik | H03K 19/173 |
| | | | 326/8 |

* cited by examiner

DETECTING SUDDEN CHANGES IN ACCELERATION IN SEMICONDUCTOR DEVICE OR SEMICONDUCTOR PACKAGING CONTAINING SEMICONDUCTOR DEVICE

BACKGROUND

Embodiments of the present invention relate generally to semiconductor device fabrication, and more specifically, to detecting an excessive force experienced by an integrated circuit or semiconductor die, or a semiconductor package containing the die that is due to sudden changes in acceleration.

Physical damage caused by dropping electronic products is generally a concern for electronic products manufacturers. For example, portable electronic devices, which can perform a variety of functions including telephonic, electronic messaging and managing personal information, can be accidentally dropped and consequently damaged. Users of these damaged electronic devices can submit warranty claims to the manufacturers of the devices. It is difficult for the manufacturers to ascertain whether the damaged devices that are received are the result of damage caused by the users or are due to certain components in the devices such as semiconductor dies or their semiconductor packages failing. In particular, it is a challenge for electronic product manufacturers to differentiate whether an electronic device received under a warranty claim was built weaker than the normal population, or whether the device experienced more extreme conditions than it was designed to withstand (e.g., dropped from an excessive height). Since the process of ascertaining whether a damaged electronic device received under a warranty claim is due to a manufacturing issue or improper handling can be difficult or impossible, some electronic manufacturers will needlessly cover repair or replacement of the device under its warranty.

SUMMARY

In one embodiment, a semiconductor device is provided. In this embodiment, the semiconductor device comprises a semiconductor die and a piezoelectric sensor embedded in the semiconductor die. The piezoelectric sensor is configured to sense a mechanical force applied to the semiconductor die. The semiconductor device further comprises an excessive force indicator coupled to the piezoelectric sensor. The excessive force indicator is configured to generate an excessive force indication in response to the piezoelectric sensor sensing that the mechanical force applied to the semiconductor die has exceeded a predetermined threshold indicative of an excessive mechanical force.

In a second embodiment, a packaged semiconductor device is provided. In this embodiment, the packaged semiconductor device comprises a semiconductor chip package substrate and a semiconductor die connected to the semiconductor chip package substrate. The packaged semiconductor device further comprises a piezoelectric sensor embedded in the semiconductor die or the semiconductor chip package substrate to sense a mechanical force applied thereto. The packaged semiconductor device also comprises an excessive force indicator coupled to the piezoelectric sensor. The excessive force indicator is configured to generate an excessive force indication in response to the piezoelectric sensor sensing that the mechanical force exceeds a predetermined threshold indicative of an excessive mechanical force.

DETAILED DESCRIPTION

Figure 1:
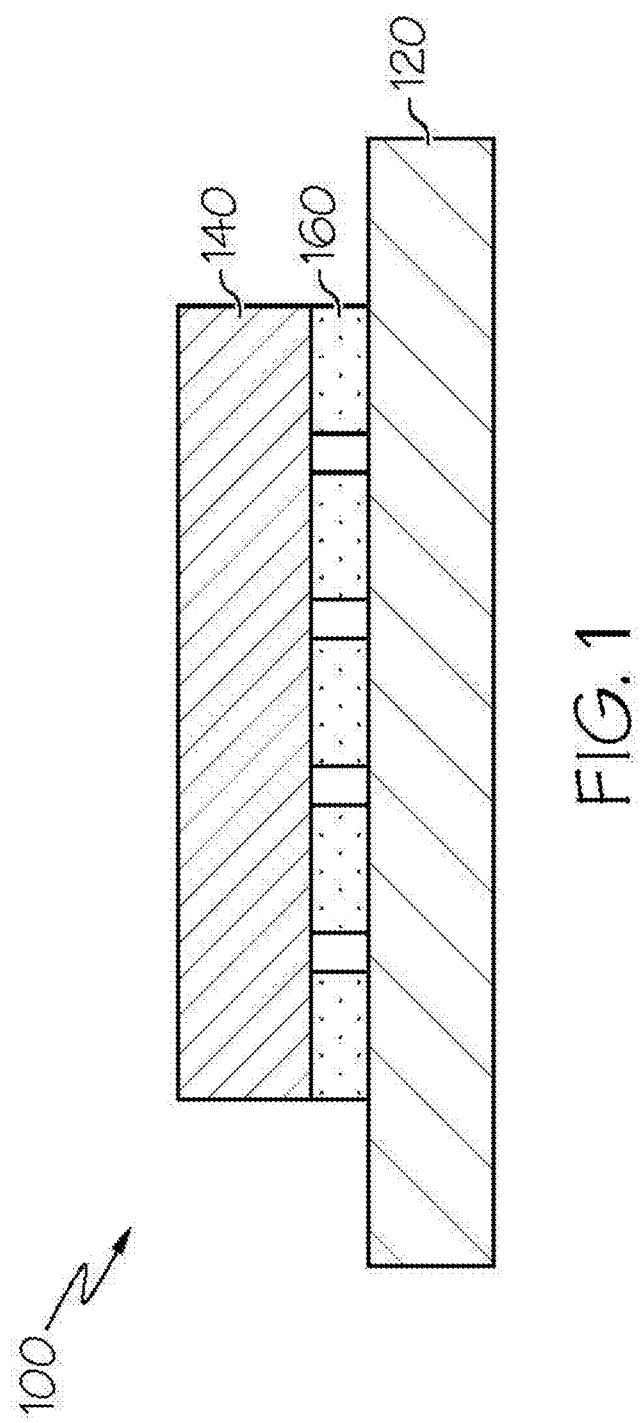
FIG. 1 shows a cross-sectional view of a packaged semiconductor device in which embodiments of the present invention may be utilized.

FIG. 1 shows a cross-sectional view of a packaged semiconductor device 100 in which embodiments of the present invention may be utilized. Packaged semiconductor device 100 includes a semiconductor chip package substrate 120 and a semiconductor die 140 having solder bumps (e.g., controlled collapse chip connection (C4) contacts) 160 attached to a surface of the die that connect to respective bond pads (not shown) disposed on a surface of semiconductor chip package substrate 120 to form a metallurgical joint. Solder bumps 160 may be any solderable material that can include, but is not limited to, material having tin and lead, tin without lead, tin with a residual of copper or silver, tin bismuth, tin indium, etc. Packaged semiconductor device 100 is only an example of one type of packaged semiconductor device in which the various embodiments of the present invention may be utilized and is not meant to be limiting. Those skilled in the art will appreciate that other interconnect technologies can be used to package semiconductor devices, all of which are suitable for use with the embodiments of the present invention. For example, wire-bond assembly and thermal compression bonding are other interconnect technologies that can be used to generate a packaged semiconductor device in addition to the one illustrated in FIG. 1 which involves a flip-chip assembly.

In the instance in which a damaged electronic device is returned by a user under a warranty claim, the manufacturer may notice that packaged semiconductor devices in the damaged electronic device similar to the one depicted in FIG. 1 may be defective (e.g., a cracked silicon or broken soldered joint). The manufacturer of the electronic device as well as the manufacturer of the packaged semiconductor devices may find it difficult if not impossible to ascertain whether the damaged electronic device was mishandled by the party submitting the warranty claim, or if the defect occurred during the manufacturing process of the packaged semiconductor devices or the electronic device itself.

Embodiments of the present invention are directed to assisting electronic device manufacturers and semiconductor manufacturers that provide semiconductor packages for use in electronic devices manufactured by the electronic device manufacturers determine the root cause of damaged devices returned on warranty claims. In particular, the various embodiments of the present invention include using an accelerometer that contains piezoelectric material and an excessive force indicator to detect whether an electronic device experienced an excessive force due to sudden changes in acceleration. In operation, the accelerometer with piezoelectric material transforms mechanical energy that is produced when the electronic device is dropped into electrical energy. This electrical energy is then used to create a detectable signal or change within the device that is correlated by the excessive force indicator to determine whether the mechanical force due to the sudden changes in acceleration is excessive enough to classify as mishandling.

The use of an accelerometer that contains piezoelectric material obviates the need to use an external power source to power on the accelerometer such as in the case with conventional accelerometers used in electronic devices. In addition, these types of conventional accelerometers may not stay part of the electronic devices for their functional lives. Furthermore, these conventional accelerometers are typically an external component of the electronic devices which can be problematic from an assembly point of view.

In the various embodiments of the present invention, the accelerometer with piezoelectric material and the excessive force indicator can be incorporated into semiconductor die 140 or on packaged semiconductor device 100. This facilitates an actual determination as to whether damaged electronic devices have been caused by improper handling, shipping or assembly. For example, if packaged semiconductor device 100 had a defect, then the accelerometer with the piezoelectric material and the excessive force indicator in the various embodiments of the present invention could assist manufacturers in determining whether packaged semiconductor device 100 was dropped, or if the defect was caused during the semiconductor packaging process. This would enable manufacturers to determine the root cause of the damage in a more efficient manner. In the case of consumer electronic products, such as cellular telephones, that have been dropped from a height that they were not designed to withstand, the various embodiments of the present invention would enable manufacturers to definitively determine "mishandling" as a root cause for the damage. As a result, this would allow manufacturers to save money on paying out warranty claims that are not due to actions of the manufacturers.

Figure 2:
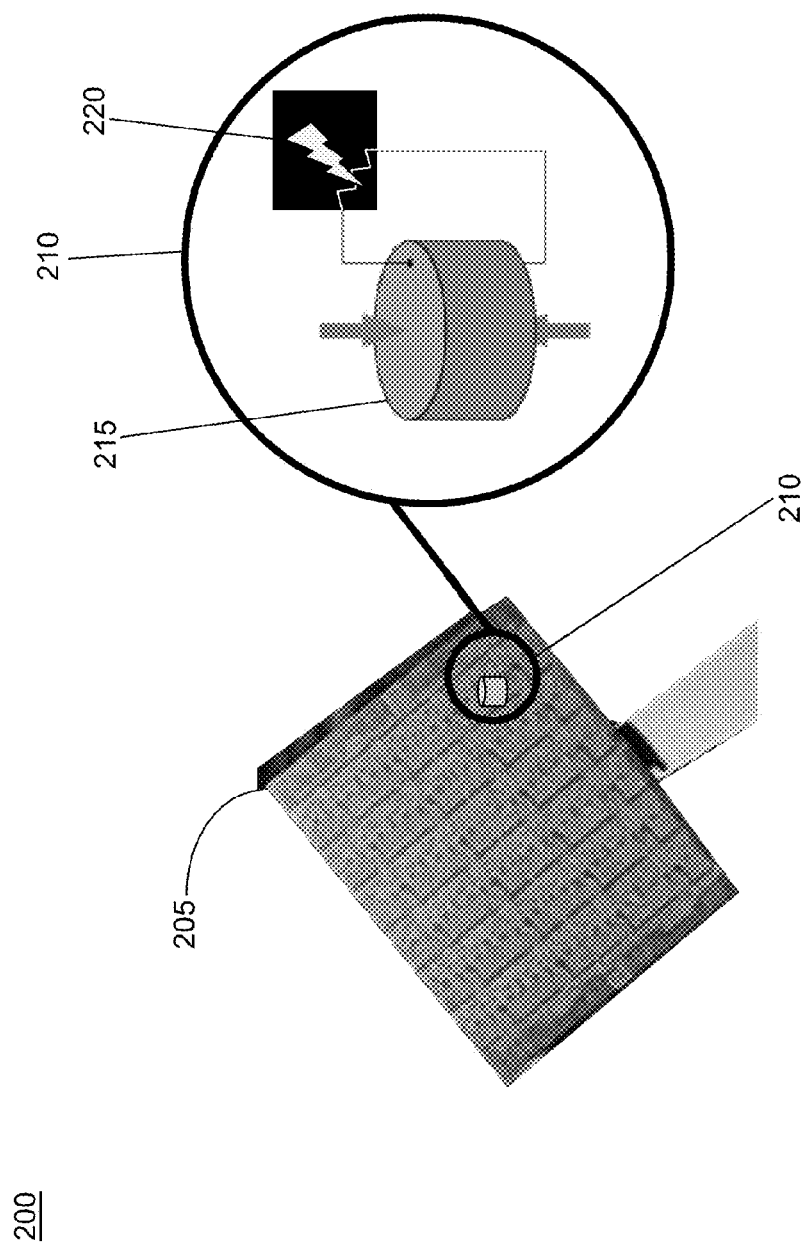
FIG. 2 shows a schematic diagram of a semiconductor device that can be used with the package semiconductor device depicted in FIG. 1 to detect an excessive force due to sudden changes in acceleration experienced by a semiconductor die in the package semiconductor device or the package semiconductor device itself according to a first embodiment of the present invention.

FIG. 2 shows a schematic diagram of a semiconductor device 200 that can be used with a package semiconductor device like the one depicted in FIG. 1 to detect an excessive force due to sudden changes in acceleration experienced by a semiconductor die or the package semiconductor device itself. As shown in FIG. 2, semiconductor device 200 comprises a semiconductor die 205 and a piezoelectric sensor 210 embedded in the semiconductor die to sense a mechanical force applied to the semiconductor die. In one embodiment, piezoelectric sensor 210 can be integrated in an accelerometer that measures dynamic changes in mechanical variables, such as for example acceleration, vibration and mechanical shock. For example, piezoelectric sensor 210 can measure mechanical forces experienced by semiconductor die 205 that are due to sudden changes in acceleration.

The exploded view of FIG. 2 on the right-hand side of the figure shows a more detailed view of piezoelectric sensor 210 within semiconductor die 205. As shown in this exploded view portion of FIG. 2, piezoelectric sensor 210 includes a piezoelectric material 215. Piezoelectric material 215 can be any material that can convert mechanical energy to electrical energy and vice versa. In addition, the piezoelectric material should be suited for detecting sudden changes in acceleration. Illustrative, but non-limiting examples of piezoelectric material that can be used in piezoelectric sensor 210 include lead zirconium titanate, barium titanate, lead magnesium niobate-lead titanate, etc.

Piezoelectric material 215 can be embedded in semiconductor die 205 in a variety of locations. For example, a single piece of piezoelectric material can be oriented in a one particular location within semiconductor die 205. In another embodiment, piezoelectric material 215 can be oriented in each axis of semiconductor die 205 to form a circuit. In this manner, the piezoelectric material 215 that is oriented in each axis of semiconductor die 205 can each generate an electrical output in response to mechanical energy. Thus, if semiconductor die 205 was dropped from a height that it was not designed to withstand, then the sum of electrical outputs from each piece of piezoelectric material would be enough to indicate an excessive force due to sudden changes in acceleration. For example, if the sum of outputs exceeds a predetermined threshold, then it could cause a fuse to blow to indicate that an excessive force was experienced.

Those skilled in the art will appreciate that the amount and location of piezoelectric material that is used will depend on the end product that the semiconductor package is used and the amount of space needed for the piezoelectric material to deform in response to mechanical energy. Furthermore, those skilled in the art will also appreciate that the amount and location of piezoelectric material that is used can depend on how the piezoelectric material is tuned. The tunability of piezoelectric material to attain a specific output is generally based on the size of the material, the plane or directionality that it is used, the type of the material and the construction of the material.

The exploded view portion on the right-hand side of FIG. 2 further shows an excessive force indicator 220 coupled to piezoelectric material 215 of piezoelectric sensor 210. Excessive force indicator 220 can be configured to generate an excessive force indication in response to piezoelectric material 215 of piezoelectric sensor 210 sensing that a mechanical force applied to semiconductor die 205 has exceeded a predetermined threshold indicative of an excessive mechanical force. Those skilled in the art will appreciate that values selected as the predetermined threshold will depend on the end product that the package semiconductor device including piezoelectric sensor 210 and excessive force indicator 220 are used with and the application of the product.

In one embodiment, an excessive force indicator 220 can generate the excessive force indication in the form of an electrical indication. In this embodiment, excessive force indicator 220 can comprise a circuit in semiconductor die 205. For example, as shown in FIG. 2, excessive force indicator 220 can include a fuse configured to blow in response to piezoelectric material 215 of piezoelectric sensor 210 detecting that electrical energy corresponding to the mechanical force experienced by semiconductor die 205 exceeds the predetermined threshold. In this manner, the circuit would be in an open state when the mechanical force exceeds the predetermined threshold and in a closed state when the mechanical force is below the predetermined threshold.

In another embodiment, excessive force indicator 220 can include a bank of fuses each configured to blow in response to the piezoelectric sensor detecting that electrical energy corresponding to the mechanical force exceeds the predetermined threshold. In this embodiment, each of the fuses can be configured to blow at a different electrical energy. In this manner, when the electrical device or end product that includes a package semiconductor device including piezoelectric sensor 210 and excessive force indicator 220 is dropped or mishandled in some fashion, then the particular fuse in the bank that is blown will provide an indication of the mechanical force that was experienced due to a sudden change in acceleration. As a result, manufacturers of the damaged end product can use that particular mechanical force to focus in on a possible root cause for the damage. Those skilled in the art will appreciate that this embodiment can be enabled because piezoelectric material 215 can be tuned in such a way that different parts of the material can each generate a different output depending on the input. In this manner, each output generated from the various tuned parts of the material can be compared to a specific threshold designated for that part of the piezoelectric material. If the electrical output generated from a specific part of the material exceeds its threshold, then its corresponding fuse will be blow.

Figure 3:
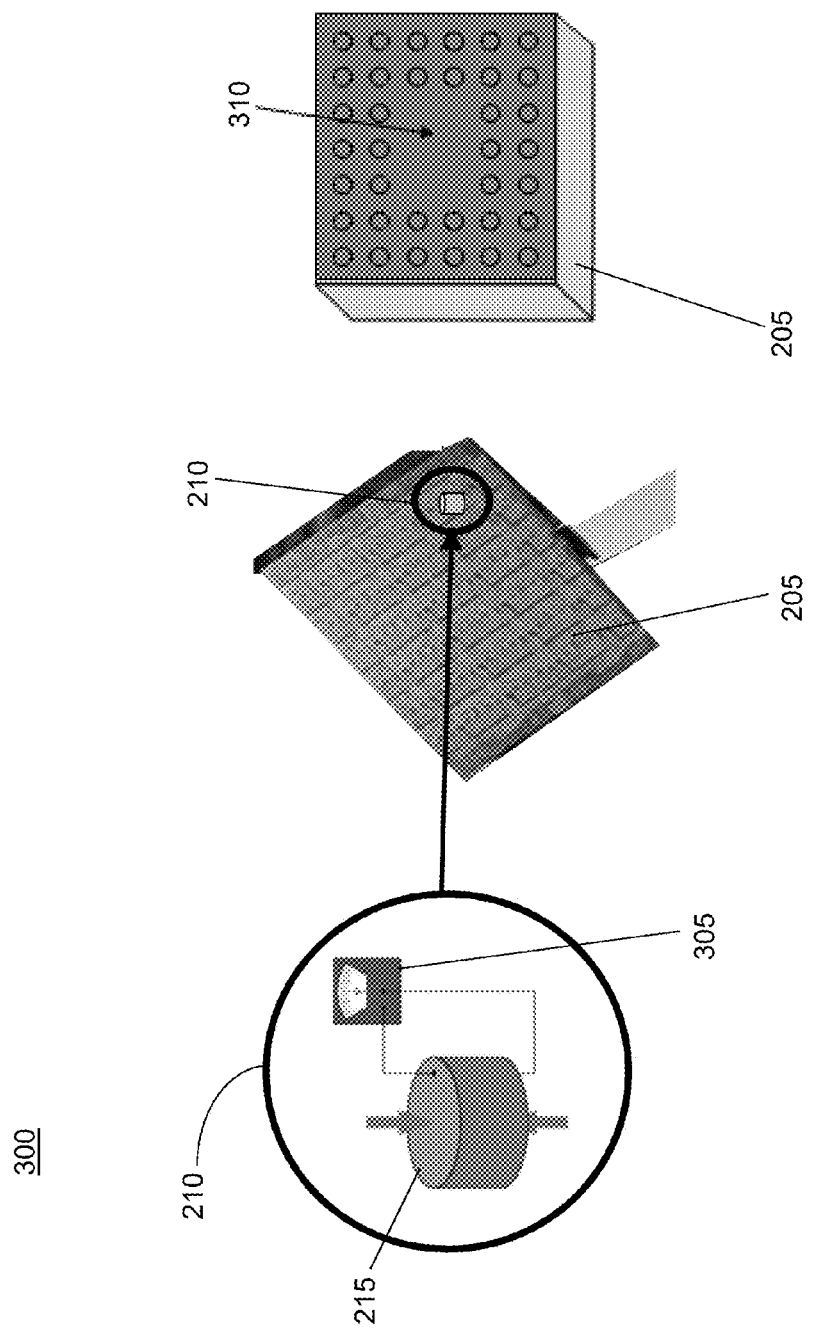
FIG. 3 shows a schematic diagram of a semiconductor device that can be used with the package semiconductor device depicted in FIG. 1 to detect an excessive force due to sudden changes in acceleration experienced by a semiconductor die in the package semiconductor device or the package semiconductor device itself according to a second embodiment of the present invention.

FIG. 3 shows a schematic diagram of a semiconductor device 300 that can be used with a package semiconductor device like the one depicted in FIG. 1 to detect an excessive force due to sudden changes in acceleration experienced by a semiconductor die or the package semiconductor device itself. As shown in FIG. 3, semiconductor device 300 comprises a semiconductor die 205 and a piezoelectric sensor 210 embedded in the semiconductor die to sense a mechanical force applied to the semiconductor die. In this embodiment, piezoelectric sensor 210 can take the form of a piezoelectric-based accelerometer that measures dynamic changes in mechanical variables such as for example acceleration, vibration and mechanical shock. For example, piezoelectric sensor 210 can measure mechanical forces experienced by semiconductor die 205 that are due to sudden changes in acceleration.

The exploded view on the left-hand side of FIG. 3 shows a more detailed view of piezoelectric sensor 210 within semiconductor die 205. As shown in this exploded view portion of FIG. 3, piezoelectric sensor 210 includes piezoelectric material 215. The exploded view on the left-hand side portion of FIG. 3 further shows a meter 305 coupled to piezoelectric material 215. Meter 305 can be a voltage meter that generates a voltage value that is proportional to the changes in acceleration detected by piezoelectric material 215. Each of these voltage values will correspond to a certain mechanical force. The mechanical forces and corresponding voltage values that are greater than a predetermined threshold are indicative of excessive mechanical forces.

The right-hand side of FIG. 3 shows that semiconductor device 300 comprises a visual excessive force indicator 310 that can generate an excessive force indication in response to piezoelectric material 215 of piezoelectric sensor 210 sensing that a mechanical force applied to semiconductor die 210 has exceeded a predetermined threshold indicative of an excessive mechanical force. In one embodiment, visual excessive force indicator 310 can comprise a color change material that is configured to change color in response to piezoelectric material 215 of piezoelectric sensor 210 detecting that the electrical energy corresponding to the mechanical force exceeds the predetermined threshold. The color change material can change color as a function of an electric field generated from piezoelectric material 215 of piezoelectric sensor 210, and a distance that separates the color change material and the piezoelectric sensor. The color change material can be any material whose color can change as a result of electrochemical reactions initiated by the electrical energy generated from a piezoelectric material responding to mechanical energy. Illustrative, but non-limiting examples of color change material that can be used as visual excessive force indicator 310 include but are not limited to, any electrochromistic material that reversibly or irreversibly changes color when exposed to an electric field. In one embodiment, the visual excessive force indicator 310 is one or more of the following electrochromistic materials: a PProDOT (i.e., 3,4-propylenedioxythiophene), a PProDOP (i.e., 3,4-propylenedioxypyrrole), a polyaniline, a viologen, a polyoxotungstate, tungsten oxide (WO3), chiral nematic liquid crystals, monomeric molecules and oligomeric molecules. Other electrochromistic materials may be used within the scope of this embodiment. For example, one or more electrochromistic materials may be selected based on the desired sensitivity level(s) of an object or structure.

Figure 4:
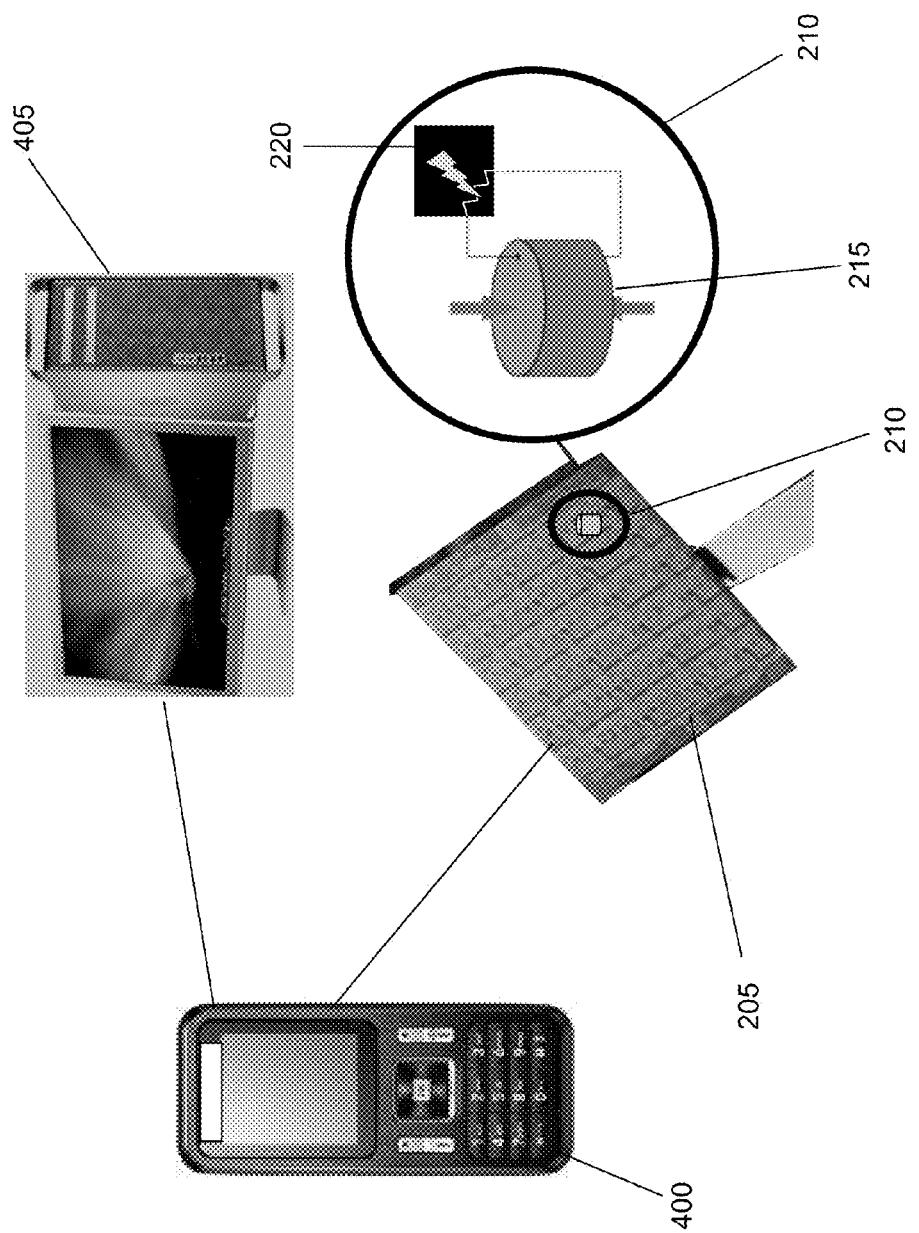
FIG. 4 is a schematic illustrating how a semiconductor device like the one depicted in FIG. 2 can be used in an electronic device to ascertain whether the electronic device experienced an excessive force due to sudden changes in acceleration according to one embodiment of the present invention.

FIG. 4 is a schematic representation of the semiconductor device 200 depicted in FIG. 2 in use with an electronic device to ascertain whether the electronic device experienced an excessive force due to sudden changes in acceleration. In FIG. 4, a semiconductor package containing semiconductor die 205 and piezoelectric sensor 210 including piezoelectric material 215 and excessive force indicator 220 is in use with a cellular phone 400. Piezoelectric sensor 210 including piezoelectric material 215 and excessive force indicator 220 is not limited to placement on semiconductor die 205 and can be placed on the semiconductor package. Furthermore, those skilled in the art will recognize that the various embodiments of the present invention are not limited to use with cellular phones. Instead, the various embodiments of the present invention are suited for use with any electronic devices or electrical devices that contain semiconductor packages and that are potentially subject to damage through actions that are difficult to definitively recognize.

In FIG. 4, a damaged or an improperly operating phone 400 can be coupled to an electronic testing system 405 programmed to electronically analyze piezoelectric sensor 210 including piezoelectric material 215 and excessive force indicator 220. In one embodiment, electronic testing system 405 can determine if excessive force indicator 220 indicates that the predetermined threshold has been exceeded. For example, if excessive force indicator 220 includes a fuse, then electronic testing system 405 would electrically determine if the fuse has blown. If electronic testing system 405 ascertains that the fuse has blown, then that is an indication that cellular phone 400 experienced a mechanical force due to a sudden change in acceleration that is not consistent with normal use of the phone. On the other hand, if electronic testing system 405 ascertains that the fuse is still intact, then this is an indication that the phone may not have been damaged by improper use or mishandling of phone 400. In this case, the manufacturer of phone 400 may have to look into other causes for the damage such as faulty components or improper assembly. Although FIG. 4 shows phone 400 electrically connected to electronic testing system 405, those skilled in the art will appreciate that other approaches exist. For example, the semiconductor package containing piezoelectric sensor 210 including piezoelectric material 215 and excessive force indicator 220 can be removed from phone 400 and connected directly with electronic testing system 405 for analysis thereof.

Figure 5:
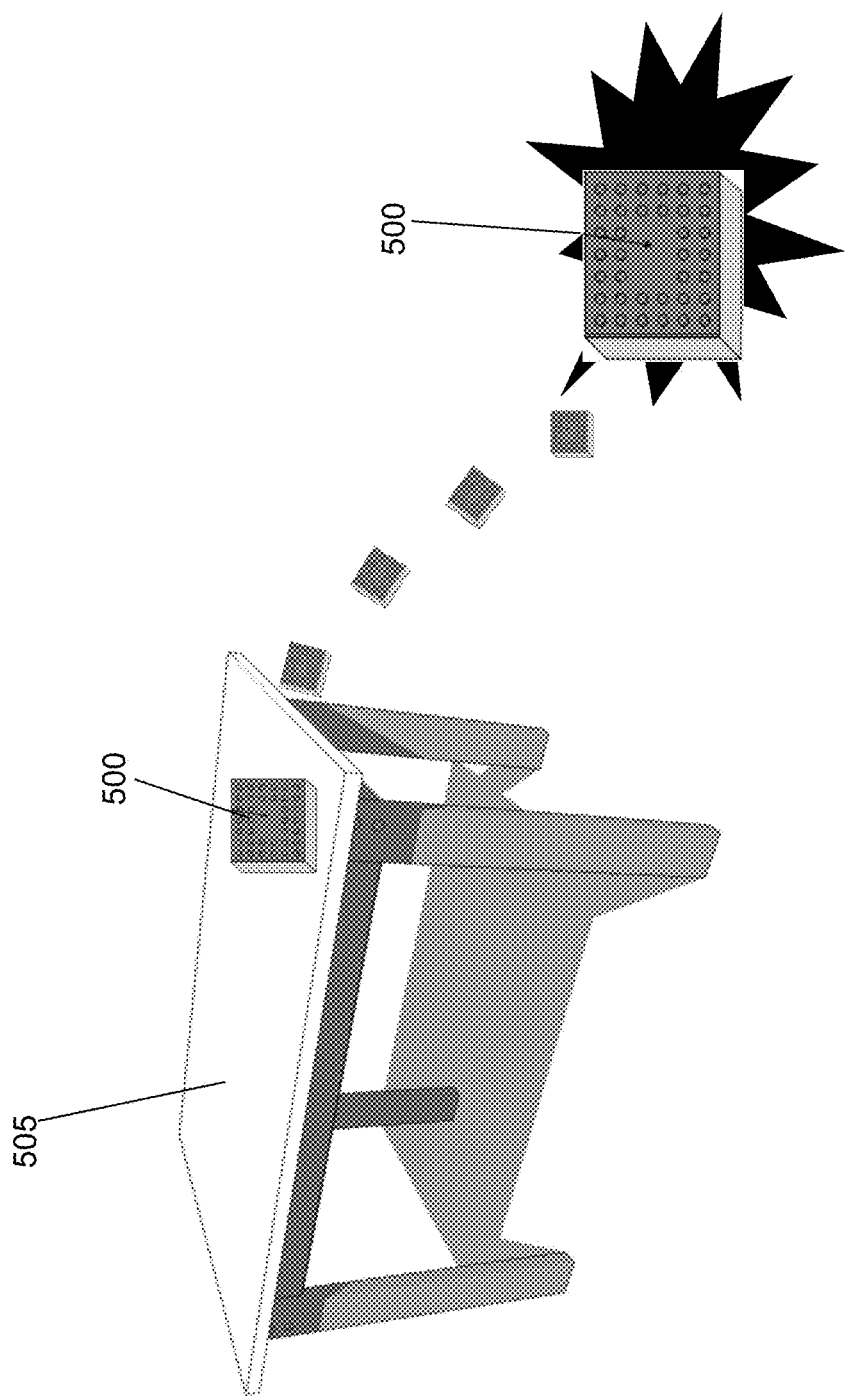
FIG. 5 is a schematic illustrating how a semiconductor device like the one depicted in FIG. 3 can be used in a semiconductor package to indicate the presence of an excessive force due to sudden changes in acceleration according to one embodiment of the present invention.

FIG. 5 is a schematic representation of an example in which the semiconductor device 300 depicted in FIG. 3 could visually indicate that it had experienced an excessive force due to sudden changes in acceleration. In FIG. 5, a semiconductor package 500 containing semiconductor die 205 and piezoelectric sensor 210 including piezoelectric material 215 and excessive force indicator 310 (shown in FIG. 3) is located on a table 505. Piezoelectric sensor 210 including piezoelectric material 215 and excessive force indicator 310 is not limited to placement on the semiconductor die and can be placed on the semiconductor package. Furthermore, those skilled in the art will recognize that the example illustrated in FIG. 5 is only one example in which the semiconductor device 300 can be used to visually indicate the instance of experiencing an excessive force and is not meant to be limiting.

In the example illustrated in FIG. 5, semiconductor package 500 falls from table 505. The color of semiconductor package 500 on top of table 505 would have a color different to the color of the package upon falling from the table and striking the ground. In this example, the mechanical force that semiconductor package 500 experiences as a result of the changes in acceleration from falling off table 505 and striking the ground is excessive enough for the piezoelectric material 215 in semiconductor package 500 to determine that the predetermined threshold has been exceeded, causing activation of the color change material.

While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the disclosure.

What is claimed is:

1. A semiconductor device, comprising:
   a semiconductor die;
   a piezoelectric sensor embedded in the semiconductor die, the piezoelectric sensor configured to sense a mechanical force applied to the semiconductor die; and
   an excessive force indicator coupled to the piezoelectric sensor, the excessive force indicator configured to generate an excessive force indication in response to the piezoelectric sensor sensing that the mechanical force applied to the semiconductor die has exceeded a predetermined threshold indicative of an excessive mechanical force, the mechanical force due to dynamic changes in at least one of: acceleration, vibration, and mechanical shock,
   wherein the excessive force indicator comprises an electrochromistic material configured to change color in response to the piezoelectric sensor detecting that electrical energy corresponding to the mechanical force exceeds the predetermined threshold and a fuse configured to blow in response to the piezoelectric sensor detecting that electrical energy corresponding to the mechanical force exceeds the predetermined threshold, and
   wherein the semiconductor device is coupled to an electronic testing system, the electronic testing system configured to determine whether the excessive force indication indicates that the predetermined threshold has been exceeded.

2. The semiconductor device according to claim 1, wherein the excessive force indicator generates an electrical indication.

3. The semiconductor device according to claim 1, wherein the fuse comprises a plurality of fuses each configured to blow in response to the piezoelectric sensor detecting that electrical energy corresponding to the mechanical force exceeds the predetermined threshold, wherein each of the plurality of fuses is configured to blow at a different electrical energy.

4. The semiconductor device according to claim 1, wherein the excessive force indicator comprises a circuit in the semiconductor die.

5. The semiconductor device according to claim 4, wherein the circuit comprises the fuse configured to blow in response to the piezoelectric sensor detecting that electrical energy corresponding to the mechanical force exceeds the predetermined threshold, the circuit in an open state in response to the mechanical force exceeding the predetermined threshold and in a closed state in response to the mechanical force being below the predetermined threshold.

6. The semiconductor device according to claim 1, wherein the excessive force indicator generates a visual indication.

7. The semiconductor device according to claim 1, wherein the color change material changes color as a function of an electric field generated from the piezoelectric sensor and a distance separating the color change material and the piezoelectric sensor.

8. The semiconductor device according to claim 1, wherein the piezoelectric sensor is integrated in an accelerometer, the piezoelectric sensor configured to detect sudden changes in acceleration experienced by the semiconductor die.

9. A packaged semiconductor device, comprising:
   a semiconductor chip package substrate;
   a semiconductor die connected to the semiconductor chip package substrate;
   a piezoelectric sensor embedded in the semiconductor die or the semiconductor chip package substrate to sense a mechanical force applied thereto; and
   an excessive force indicator coupled to the piezoelectric sensor, the excessive force indicator configured to generate an excessive force indication in response to the piezoelectric sensor sensing that the mechanical force exceeds a predetermined threshold indicative of an excessive mechanical force, the mechanical force due to dynamic changes in at least one of: acceleration, vibration, and mechanical shock,
   wherein the excessive force indicator comprises an electrochromistic material configured to change color in response to the piezoelectric sensor detecting that electrical energy corresponding to the mechanical force exceeds the predetermined threshold and a fuse configured to blow in response to the piezoelectric sensor detecting that electrical energy corresponding to the mechanical force exceeds the predetermined threshold, and
   wherein the packaged semiconductor device is coupled to an electronic testing system, the electronic testing system configured to determine whether the excessive force indication indicates that the predetermined threshold has been exceeded.

10. The packaged semiconductor device according to claim 9, wherein the excessive force indicator generates an electrical indication.

11. The packaged semiconductor device according to claim 9, wherein the fuse indicator fuse comprises a plurality of fuses each configured to blow in response to the piezoelectric sensor detecting that electrical energy corresponding to the mechanical force exceeds the predetermined threshold, wherein each of the plurality of fuses is configured to blow at a different electrical energy.

12. The packaged semiconductor device according to claim 10, wherein the excessive force indicator comprises a circuit having the fuse in the semiconductor die that is configured to blow in response to the piezoelectric sensor detecting that electrical energy corresponding to the mechanical force exceeds the predetermined threshold.

13. The packaged semiconductor device according to claim 12, wherein the circuit is in an open state in response to the mechanical force exceeding the predetermined threshold and in a closed state in response to the mechanical force being below the predetermined threshold.

14. The packaged semiconductor device according to claim 9, wherein the excessive force indicator generates a visual indication.

15. The packaged semiconductor device according to claim 9, wherein, the color change material changes color as a function of an electric field generated from the piezoelectric sensor and a distance separating the color change material and the piezoelectric sensor.

16. The packaged semiconductor device according to claim 9, wherein the piezoelectric sensor is integrated in an accelerometer, the piezoelectric sensor configured to detect sudden changes in acceleration experienced by the semiconductor die.

17. The semiconductor device according to claim 1, wherein the electrochromistic material includes at least one of: 3,4-propylenedioxythiphene, 3,4-propylenedioxypyrrole, a polyaniline, a viologen, a polyoxotungstate, tungsten oxide, chiral nematic liquid crystals, monomeric molecules or oligomeric molecules.

18. The packaged semiconductor device according to claim 9, wherein the electrochromistic material includes at least one of: 3,4-propylenedioxythiphene, 3,4-propylenedioxypyrrole, a polyaniline, a viologen, a polyoxotungstate, tungsten oxide, chiral nematic liquid crystals, monomeric molecules or oligomeric molecules.

19. The semiconductor device according to claim 1, wherein the excessive force indicator indicates misuse or mishandling of the semiconductor device in response to the piezoelectric sensor detecting that electrical energy corresponding to the mechanical force exceeds the predetermined threshold.

20. The packaged semiconductor device according to claim 9, wherein the excessive force indicator indicates misuse or mishandling of the packaged semiconductor device in response to the piezoelectric sensor detecting that electrical energy corresponding to the mechanical force exceeds the predetermined threshold.

* * * * *